STAR TRACKING RETICLES

Original Filed Oct. 12, 1970

United States Patent Office 3,759,672
Patented Sept. 18, 1973

3,759,672
STAR TRACKING RETICLES

Wade O. Smith, Bowie, and Albert R. Toft, Edgewater, Md., assignors to the United States of America as represented by the Administrator of the National Aeronautics and Space Administration Original application Oct. 12, 1970, Ser. No. 80,029, now Patent No. 3,702,808, dated Nov. 14, 1972. Divided and this application Apr. 17, 1972, Ser. No. 244,440
Int. Cl. B32b *15/04*
U.S. Cl. 29—195 Y 6 Claims

ABSTRACT OF THE DISCLOSURE

A method for the production of reticles, particularly those for use in outer space, wherein the product is a quartz base coated with highly adherent layers of chromium, chromium-silver, and silver vacuum deposited through a mask, and then coated with an electrodeposit of copper from a copper sulfate solution followed by an electrodeposit of black chromium. The masks are produced by coating a beryllium-copper alloy substrate with a positive working photoresist, developing the photoresist according to a pattern to leave a positive mask, plating uncoated areas with gold, removing the photoresist, coating the substrate with a negative working photoresist, developing the negative working photoresist to expose the base metal of the pattern, and chemically etching the unplated side of the pattern to produce the mask. The mask produced is then used in the vacuum deposition of: (1) chromium metal on the surface of a quartz base to obtain a highly adherent quartz-chromium interface; (2) silver on the chromium deposit, during the final stage of chromium deposit, to produce a silver-chromium alloy layer; and (3) silver onto the surface of the alloy layer. The coated quartz base is then coated by electroplating utilizing an acid copper deposit followed by a black chromium electrodeposit to produce the product of the present invention.

ORIGIN OF THE INVENTION

The invention described herein was made by employees of the United States Government and may be manufactured and used by or for the Government for governmental purposes without the payment of any royalties thereon or therefor.

This application is a divisional application of Ser. No. 80,029, filed Oct. 12, 1970 now Pat. 3,702,808, dated Nov. 14, 1972.

INTRODUCTION

The present application is directed towards a process for producing high resolution, substantially non-reflective "reticles" or "choppers" suitable for use for transmitting in both the visible and near ultra-violet regions, able to withstand reasonable handling and extreme environmental conditions, and capable of operating at speeds of from 2800 to about 9000 revolutions per minute (r.p.m.) without distortion. In particular, the present invention is directed towards the production of reticles having a quartz base vacuum coated with chromium, chromium-silver alloy, and silver with electrodeposited copper and black chromium thereon, respectively, in the form of a reticle pattern. The quartz permits the transmission of light while the pattern is opaque to light.

The reticles of the present invention are intended for use in optical trackers, such as star trackers used in outer space. A disclosure of exemplary reticle designs, and the uses thereof, may be found in copending application Ser. No. 668,257, filed Sept. 15, 1967, now U.S. Pat. 3,532,894, by Edward J. Devine. In this application, various types of reticles and methods for the use therefor are disclosed. Reticles of a similar type can also find significant non-space use in, e.g., telescope trackers and alignment detectors.

BACKGROUND OF THE INVENTION

Numerous methods of coating siliceous bases with metals are disclosed in the prior art. However, such methods do not provide, as a general rule, sufficiently adherent bonding between the metal layer and the siliceous base to produce a durable product. An exemplary method for coating metals on substrates is taught in U.S. Pat. No. 3,203,827, wherein chromium is plated on a substrate by the use of a bis(arene) chromium compound. Such plating however, when the coating required is quite thin, does not adhere well to and is easily removed from a substrate. Thus, processes such as the decomposition of organometallic compounds, for the reason of poor adherence alone, are not suitable for producing very thin layer products, especially reticles for use in outer space. In addition, these processes would tend to contaminate the quartz and therefore adversely affect its optical properties.

In order to produce a reticle which may be useful in a star tracker for space navigation in unmanned space probes, counter-rotating reticles, as disclosed in the above noted patent application, are required. These reticles must have: (1) a high transmission of light through the quartz in the visible and ultraviolet regions; (2) minimal reflection from opaque coating and clear surfaces; and (3) no out gassing under vacuum. In addition, they must be structurally sound so that they can survive space craft launch environments and high speed rotation without distortion.

Under these circumstances, neither the chemical deposition of silver on a quartz substrate nor the vacuum deposition of silver directly on quartz result in a quartz-metal bond sufficiently strong to survive the launch environment. Thus, to achieve a reticle, particularly adaptable for space applications, it is necessary that it be produced by another method so that the resulting product will have strong adherence quality and also possess the other characteristics enumerated above. The invention, as will be described in detail hereinafter, will accomplish this.

Thus, it is an object of the present invention to produce a quartz base reticle which has a strongly bonded, durable coating of materials, formed as a reticle pattern, with the quartz having high light transmission characteristics in the visible and ultraviolet regions and the reticle pattern being substantially non-reflective.

Another object of the present invention is to produce reticles having minimal reflection on both the opaque and clear surfaces thereof.

A further object is the production of a reticle having no outgassing under vacuum.

Further objects will become clear as the present specification is read.

SUMMARY OF THE INVENTION

The objects of the present invention are obtained by a novel process wherein a mask is produced, for example, from a beryllium-copper alloy by utilizing photoresist techniques and chemical etching of the beryllium-copper alloy; a quartz disc is coated with chromium, chromium-silver alloy, and silver in accordance with the mask pattern; and the silver is electroplated, first with copper and then with black chromium over the copper.

Figure 1:
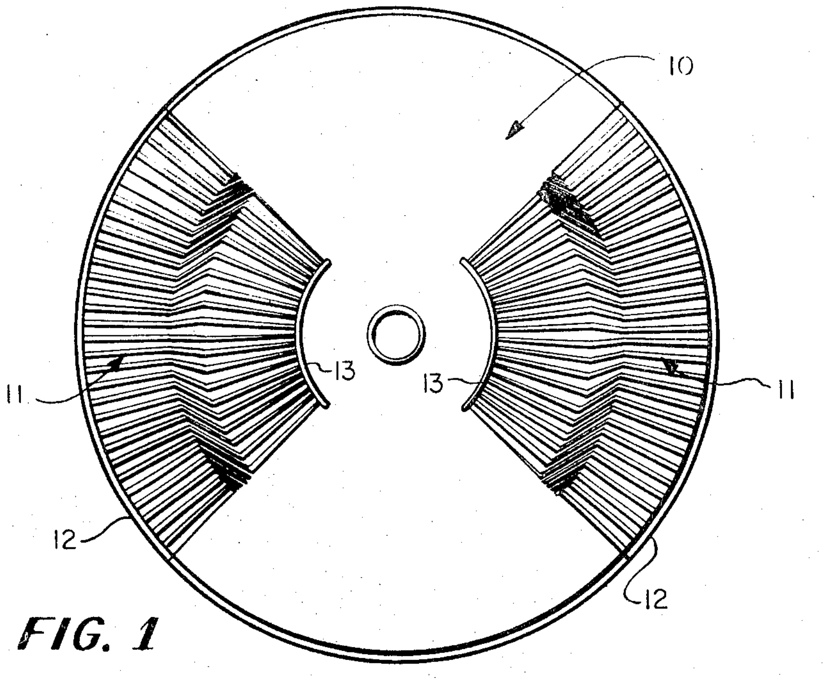
FIG. 1 shows a general view of one particular design of a reticle produced according to the present invention.

In FIG. 1, a quartz base 10 has coated thereon a reticle pattern 11 and electrodes 12 and 13 of chromium, chromium-silver alloy, silver, copper, and black chromium deposited in that order.

Figure 2:
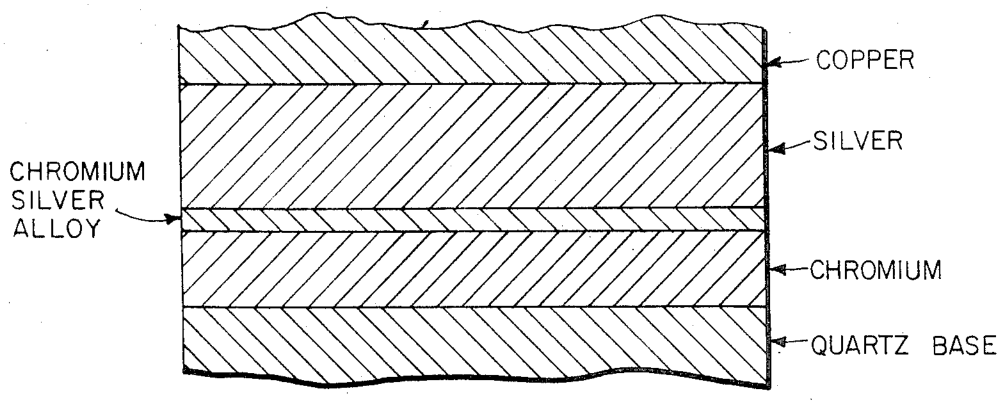
FIG. 2 shows the strong adherent bond produced by the process of the present invention at the point where the vacuum deposition process has been completed, the mask has been removed, and the electroplate has been started.

In FIG. 2, the quartz base is shown with the chromium layer vacuum deposited adjacent thereto, the alloy interface of the chromium-silver vacuum deposited above the chromium layer, the silver layer vacuum deposited above the alloy layer, and copper layer electrodeposited on the silver layer. The quartz base and the copper layer have been sectioned away.

DESCRIPTION OF THE PREFERRED EMBODIMENTS

The reticles of the present invention comprise a quartz base which may be of any size so long as it meets the requirements of high light transmission in the visible and ultraviolet regions. In addition, the reticles must have minimal reflection of both the opaque pattern and clear surfaces. An exemplary size and shape of the quartz base would be an 80 mm. diameter quartz disc of 2 mm. thickness. However, of course, the thickness and the size of the base would vary with the particular star tracker for which the reticle is being designed.

The quartz base has bonded thereto, through a reticle pattern mask, a vacuum deposited layer of chromium of from about 500 to 700 angstroms (A.), preferably about 575 to 625 A., and most preferably 600 A. Bonded to the pure chromium layer is an alloy layer of chromium and silver sufficient to bond the chromium to the silver. This layer usually contains constantly varying amounts of silver and chromium since they are vacuum deposited simultaneously; i.e., while the chromium is still being deposited, the deposition of the silver is started. This alloy layer is quite important to the process of the present invention in that it assures the structural soundness of the reticle product. However, the thickness of this varying concentration alloy layer depends upon the thickness of the chromium and silver layers to be deposited as well as the particular reticle uses desired. The requirement is that the layer be present and be sufficient to bond the chromium to the silver. Upon terminating the deposition of the chromium, there is obtained the relatively pure silver layer of from about 2500 to about 4500 A., preferably about 3000 to 4000 A., and most preferably 3150 A. This layer, of course, is the useful layer in the reticle since it is upon this layer which the copper and thereafter the black chromium are electroplated. Therefore, as noted above, the primary object of the present invention, in the production of a useful reticle, is accomplished by achieving good adhesion between the silver and the quartz through the prior application of the chromium and chromium-silver alloy.

Coated over the silver layer is a copper layer which has been electrodeposited to a thickness of from about 0.25 to a thickness of from about 0.045 to about 0.06 mil, and most preferably 0.32 mils. This copper layer must be heavy enough to cover any microscopic holes in the previously applied, vacuum deposited layers. Finally, in order to achieve a non-reflective surface, a black chromium layer formed of a mixture of chromium and chromium oxides is electrodeposited over the copper layer to a thickness of from about 0.045 to about 0.06 mil, preferably about 0.048 to 0.052 mil, and most preferably about 0.05 mil. Deposits of the black chromium thicker than these ranges are generally undesirable since they can result in loose deposits. On the other hand, the black chromium should not be deposited too thin since the resultant reticle pattern must have a minimum, and, preferably, no back reflection of the light incident thereon.

In the overall process of the present invention, the following procedure is followed. Quartz bases are cut, ground, and polished to produce a smooth surfaced material. The reticle pattern is determined and enlarged to a scale where it may be photoreduced; and the photoreduced version is utilized to produce a beryllium-copper blank which forms the mask utilized in producing the reticle pattern 11, shown in FIG. 1. After completing the production of the mask, the quartz base is positioned on the mask. Thereafter, the two are placed in an evacuation chamber and the chromium, chromium-silver, (and silver) layers are deposited thereon, in that order, as a continuous process, followed by the removal of the mask, thereby leaving on the quartz the reticle pattern 11, as seen in FIG. 1.

Next, a second mask is prepared in the same manner as reticle pattern mask, except that this second mask contains the pattern of the terminals 12 and 13, as shown in FIG. 1. The quartz base is then positioned on this latter mask; the two are placed in the evacuation chamber; and the chromium, chromium-silver, and silver layers are deposited, just as was the case with the reticle pattern, to form the pattern of terminals 12 and 13, as seen in FIG. 1. These terminals do not form a part of the usable reticle but rather provide electrical continuity with the reticle pattern so the copper and black chromium can be electroplated, in that order, on top of the previously vacuum deposited silver coating.

Upon completion of the deposition of the silver layer, the quartz with the coated reticle is removed from the evacuated chamber and positioned in a fixture which makes electrical contact with terminals 12 and 13. Thereafter, the fixture containing the reticle is placed in a standard electroplating bath wherein a copper layer is electroplated over the silver layer. Finally, a black chromium layer is deposited over the copper layer via electrodeposition techniques; and the resultant reticle product is removed from the black chromium electrodeposition bath and prepared for use in a star tracker system.

In the process of the production of the masks of the present invention, beryllium-copper blanks are cut to the proper size and drilled to produce registration alignment means. Thereafter, the blanks are cleaned and coated with a positive working photoresist. Then, the photoresist on one blank is developed in accordance with a pattern produced by the photoreduction of a larger pattern designed for the particular reticle, and the photoresist on the other blank is developed in accordance with a pattern produced by the photoreduction of a larger pattern designed for the particular electrodes. Both beryllium-copper blanks are next coated optionally first with nickel and then with gold in such a manner as to plate only on the uncoated, non-pattern areas (where the photoresist has been removed by the developer). The nickel provides additional regidity and the gold allows for the resultant pattern to have sharp edges. In some instances, where rigidity is not critical, the beryllium-copper blanks need only be plated with gold, omitting the nickel coating. Next, both blanks are recoated with a negative working photoresist, and the negative working photoresist is developed in order to expose the bare beryllium-copper reticle pattern on one blank and the bare beryllium-copper pattern of terminals on the other blank. Both blanks are then chemically etched to remove the exposed beryllium-copper patterns and produce the two desired masks.

The reticles of the present invention are prepared by placing the reticle mask over the previously prepared quartz base, and then placing the two in a vacuum chamber containing separate receptacles of chromium and silver, e.g., in pellet form. The chamber is then evacuated to a pressure of preferably about $5\times10^{-6}$ mm. of mercury. The pressure should generally not exceed $5\times10^{-4}$ mm. of mercury. With a lower pressure setting, the temperature necessary to evaporate the metals can be reduced or, alternatively, with the same temperature, the vacuum deposition may be effected more quickly.

The vacuum deposition of the chromium is done by resistance heating the chromium in its receptacle, for example, a tungsten boat of about 0.005 inch thickness. A sufficient amount of current, at a given voltage setting, is supplied, via a resistance heating circuit, to the tungsten boat in order to evaporate the chromium. The amount of current necessary to effect this evaporation varies, of course, with the voltage utilized in the resistance heating system and with the pressure utilized in the vacuum system. An exemplary situation is a pressure of about $5\times10^{-6}$ mm. of mercury at a voltage of 10 volts and a current of about 125 amps. The chromium could also be evaporated with the current being in excess of 125 amps. As a matter of fact, a current as high as 400 amps could be utilized in order to evaporate the chromium more quickly, should it be desired.

During the time of the chromium deposition, silver, previously placed in a tantalum boat of 0.005 inch thickness, is heated via a separate resistance circuit at a rate such that the deposition of silver begins just prior to the desired maximum termination of the chromium deposit. That is, in order to produce the critical bond alloy of the chromium to the silver, it is necessary that the silver deposition start just prior to the termination of the chromium deposition. Thus, the two heating sequences (evaporation of chromium and silver) must overlap to achieve the co-deposit of the chromium and silver. However, it should be noted that the actual thickness of the overlap alloy layer is not particularly critical so long as it is sufficient to give the desired bonding. Preferably, this alloy layer should be in a range from 25 to 100 A., and more preferably it should be 50 A. Thus, for example, the chromium deposition could be continued to a level of about 600 A. before silver evaporation begins to occur. At this point, then, the alloy layer would begin to form and the chromium would be slowly reduced in temperature, via a reduction in current to the resistance heating circuit for the chromium, and the silver deposition would be increased by an increase in the amount of current to the silver resistance heating circuit. When the chromium layer plus the alloy layer reaches, for example, approximately 650 A., then the chromium is no longer deposited, and the silver is the only material being deposited. Ideally, at 625 A. thickness, the alloy of chromium and silver would be 50–50 with the chromium decreasing to this level starting at 600 A. and the silver increasing from this level starting at 625 A. At this point, the silver deposition is continued until the desired total thickness of about 3800 A. is obtained. In this example, the thickness of the alloy layer is approximately 50 A., the thickness of chromium layer is about 600 A. and the thickness of the silver layer is about 3150 A.

The process conditions for the chromium and silver evaporations are, for example: 125 amps at 10 volts and $5\times10^{-6}$ mm. of mercury for chromium, and 170 amps at 10 volts and $5\times10^{-6}$ mm. of mercury for silver. These conditions, as noted above, may vary considerably depending upon the desired speed of deposition, and, of course, upon the timing necessary in order to obtain the desired alloy interface thickness.

Upon completion of the vacuum deposition steps relating to the formation of the reticle pattern, the vacuum chamber is re-pressurized to atmospheric pressure, the coated quartz unit and reticle pattern mask are removed from the vacuum chamber, and the mask is removed from the coated quartz unit. The process just described, as used in vacuum depositing the reticle pattern, is again repeated, but this time using the pattern of terminals mask. In this manner, both the reticle pattern and pattern of terminals are vacuum deposited on the quartz base.

At this point, the reticle is ready for the electrodeposition of copper in accordance with ordinary aqueous copper sulfate/sulfuric acid procedures. The thickness of the copper layer is according to those disclosed above. In the copper electrodeposition it is preferable that an acid copper bath of the types well known in the art be used. An exemplary type of bath would contain copper sulfate and sulfuric acid in an aqueous solution with conventional additives such as brighteners and wetting agents, etc. A typical electrodeposition bath would be run at about 2⅓ amps per square inch of the vapor deposited pattern (reticle pattern and pattern of terminals) and at about 75° F., although the temperature may vary from about 70 to 120° F., and is not really critical except as is known in the art of electrodeposition. The deposition may be run at about 2 volts for about 20 minutes to produce the desired coated thickness of copper on the reticle pattern which acts as the cathode, the anode being copper bars.

The black chromium deposit is then done by utilizing, for example, about 9 volts at about 4 amps per square inch of the copper electrodeposited pattern for about 1 minute and then about 6 volts at about 2 amps per square inch of the same pattern for about 2 minutes in a standard black chromium plating bath at about, for example, 90° F. The temperatures may vary from about 90° to about 115° in the bath, or other temperatures as is known in the art. An exemplary bath would contain standard black chromium depositing components such as chromic acid, acetic acid, and barium acetate as well as conventional additives. The anodes in such baths are lead, and the resulting black chromium deposit contains up to about 75% chromium, the rest being various oxides of chromium. By this electrode deposition of black chromium, the reflectance of the final reticle product is about 5%, i.e., the reflectance from both the reticle pattern and the plain quartz is the same 5%. Thus, the reflectance characteristics of the reticle pattern are greatly minimized by this final black chromium coating. To further minimize the reflectance of the final reticles product, magnesium fluoride can be vacuum deposited thereon.

Example

A reticle processed in accordance with the present invention was produced by the following steps. A quartz blank was cut to 80 mm. diameter and 2 mm. in thickness and ground and polished to an optical finish. The desired reticle pattern was then designed and prepared on a master pattern as art work which was greatly enlarged over that of the size of the final reticle product. The art work was the same as that shown as the reticle pattern 11 in FIG. 1 for the final product, but of a different size. A similar type of art work was prepared for the pattern of the terminals 12 and 13. The art works were both then reduced by about 20 to 1 using a precision engineering copy camera to produce accurate small master reproductions of them. Two positive films (front and rear of the respective small master) of each of these small masters were made. Each pair was independently aligned with the aid of a microscope, taped together, and aligned with a drill template which in turn was used as a guide for the drilling of pilot holes, 3.1 mm. in diameter, in diagonally opposite corners of the film pair in combination with the drill template. The pilot holes, made in this manner, served for alignment purposes.

Next, two masks (one for the reticle pattern and the other for the pattern of terminals) were produced by drilling pilot holes (for alignment with the pilot holes in the positive film) in beryllium/copper blanks of 1/4 hardness and 0.127 mm. thickness by 100 x 150 mm. The drilled beryllium-copper blanks were then cleaned and coated on both sides with a positive working resist of the Shipley A.C. type III. The reticle pattern was then printed by using Teflon pins to align the front reticle pattern bearing positive film on one side of one of the beryllium-copper blanks. The developing of this printing produced a resist coated reticle pattern with the remaining areas on the front side of the blank free of resist and the rear side coated with resist. This bare beryllium-copper reticle pattern was then electroplated with 0.3 mils of non-cyanide alkaline gold. After the gold electroplating, the remaining resist was removed from the front and rear of the blank and both sides of the blank were recoated with a negative working resist of the KPR type. Then, using the front and rear reticle pattern bearing the positive film properly aligned by the Teflon pins to the front and rear, respectively, of the blank, the reticle pattern was printed, in turn, on both sides of the blank. Next, the images on both sides of the blank were developed, leaving the reticle pattern exposed on each side for chemical machining.

The chemical machining, or etching, was done by using a double sided spray etcher and a ferric chloride solution. The etching was first done from the rear, non-gold-coated side, with the front side being covered with a glass-epoxy circuit board to prevent etching on that side. Upon observing penetration on the front side of the blank, the circuit board was removed from the front side of the blank and etching was proceeded through both sides of the blank. In this manner, there is formed the mask for the reticle pattern with the gold plated side on the front of the blank behaving as a sharp edge for the reticle pattern.

The same technique, as used in preparing the reticle mask, was again repeated, only this time with the beryllium-copper blank that becomes the mask for the pattern of terminals. Thus, there was fabricated two masks, one for the reticle pattern and the other for the pattern of terminals. By use of the pattern of terminals mask, as explained above, there is provided terminals on the quartz reticle which connect the ends of the vapor deposited reticle pattern coated thereon to each other so that the electroplating procedures may be accomplished. It should be understood, of course, if the ends of the reticle pattern should already be interconnected, then it would be unnecessary to form the second mask for the pattern of terminals. In such a case, the vacuum deposition, as will next be described, could be carried out by the use of the single reticle mask.

Next, the polished quartz and the reticle mask were mounted together and placed in a vacuum deposition chamber; the vapor pressure in the chamber was reduced to $5\times10^{-6}$ mm. of mercury; and chromium was evaporated from a resistance heated tungsten boat source of chromium pellets (the boat source being located within the chamber) at 10 volts and 125 amps to deposit through the mask to form a chromium reticle pattern of 600 A. thickness on the quartz. During the latter portion of the period of deposition of the chromium layer, a separate resistance heated tantalum boat source of silver pellets was heated at a rate such that the silver pellets reached an evaporation temperature just prior to the chromium evaporator current being turned off. The silver evaporation was done at 10 volts and 170 amps. Since it was started prior to the termination of the evaporation of the chromium, there was formed, as described above, a thin layer, approximately 50 A. thickness, of an alloy of chromium and silver between the pure chromium and the pure silver layers. The silver was deposited to a thickness of 3150 A. Upon this thickness being achieved, the resistance heating of the silver pellets was terminated and the reticle mask removed from the quartz. A Sloane crystal oscillator was placed in the vacuum chamber to indicate the deposition depth of the chromium via varying the oscillation frequency of the crystal.

In summary then, the chromium layer was deposited to a thickness of 600 A.; a short overlap was allowed between the chromium and silver depositions for the chromium-silver layer to be formed; and the silver layer was deposited to a thickness of 3150 A.

The same procedure, as just described in connection with vapor depositing the chromium and silver as the reticle pattern on the quartz, was repeated using the pattern of terminals mask to achieve the deposition of chromium and silver to form the terminals on the quartz.

After completing the vapor deposition of chromium and silver to form both the reticle pattern and the pattern of terminals, the quartz disc with the visible silver deposits thereon was inserted into a fixture which made electrical contact with the terminals. Thereafter, the fixture, with the quartz therein, was placed in a standard acid copper electrodeposition bath and copper deposited to a thickness of 0.3 mil. The copper bath was of the bright copper sulfate type containing copper sulfate, sulfuric acid, standard brighteners, and wetting agents in an aqueous solution. The copper deposition was done at 2⅓ amps per square inch of the vapor deposited pattern at a temperature of 75° F. for a period of 20 minutes. The voltage utilized during this deposition was 2 volts and the anode was copper bars.

Next, the fixture, holding the quartz with the copper coated reticle, was placed in a standard black chromium electrodeposition bath. The black chromium bath contained chromic acid, acetic acid, and barium acetate along with standard electrodeposition additives. The deposition was carried out at 4 amps per square inch of the copper electro-deposited pattern at 9 volts for one minute and then 2 amps per square inch of the same pattern at 6 volts for 2 minutes, in each case, at 90° F. The anode used was lead. The resultant black chromium electrodeposit was 0.05 mil thick and contained about 75% chromium and 25% oxides of chromium.

The finished quartz reticle product, in the quartz areas, had good transmission qualities in the visible and ultraviolet regions, and, at the same time, the surface thereof, including the quartz and total pattern (reticle and terminals), was very low in reflectance of light and could be readily handled without causing the lifting or maring of the metal coated layers, particularly the resultant black chromium layer. Accordingly, the quartz recticle product is ideally suited for applications in outer space. Additionally, it also can find significant non-space use in telescope trackers and alignment detectors.

Although the process of the invention, as described in the example, required the making and use of two masks, one used in the vacuum deposition to form the reticle pattern and the other used in the vacuum deposition to form the pattern of terminals, it should be quite apparent, in many instances, that only one mask would be needed, this being particularly true where the required pattern would have electrical continuity within itself, thereby permitting the electrodeposition steps to be performed. Further, it is contemplated, in some instances, it may very well be desirable to use more than 2 masks.

Moreover, while a preferred embodiment of the present invention has been described in detail, various modifications, alterations or changes may be made without departing from the spirit and scope of the present invention as defined in the appended claims.

What is claimed is:

1. A reticle comprising a quartz base having coated thereon from 500 to 700 angstroms of chromium, from 2500 to 4500 angstroms of silver, from 0.25 to 0.35 mil of copper, and from 0.045 to 0.06 mil of black chromium, in that order, said silver and chromium layers intermixed to a sufficient degree to produce an alloy of chromium and silver which bonds said silver and chromium layers together.

2. The product of claim 1 wherein said chromium layer is from 575 to 625 angstroms.

3. The product of claim 1 wherein said silver layer is from 3000 to 4000 angstroms.

4. The product of claim 1 wherein said copper layer is from 0.28 to 0.32 mils.

5. The product of claim 1 wherein said black chromium layer is from 0.048 to 0.052 mil.

6. A reticle comprising a polished quartz base having coated thereon, in order, 600 angstroms of chromium, 50 angstroms of a bonding layer of chromium silver alloy, 3150 angstroms of silver, 0.03 mil of copper, and 0.05 mil of black chromium.

References Cited

UNITED STATES PATENTS 3,443,915 5/1969 Wood et al. -------- 29—195 G

OTHER REFERENCES

IBM Technical Disclosure Bulletin, vol. 13, No. 12, May 1971; KiNiTu: "Oriented Metallic Films."

L. DEWAYNE RUTLEDGE, Primary Examiner

E. L. WEISE, Assistant Examiner

U.S. Cl. X.R.

29—195 G, 199